United States Patent [19]

Nakano et al.

[11] Patent Number: 5,334,846
[45] Date of Patent: Aug. 2, 1994

[54] CORRECTION OF CHARGED PARTICLE BEAM EXPOSURE DEFLECTION BY DETECTING STAGE POSITION AND A POSITION DETECTION MARK

[75] Inventors: Mitsuhiro Nakano, Kasugai; Junichi Kai, Kawasaki, both of Japan

[73] Assignees: Fujitsu Limited, Kawasaki; Fujitsu VLSI Limited, Kasugai, both of Japan

[21] Appl. No.: 907,018

[22] Filed: Jul. 1, 1992

[30] Foreign Application Priority Data

Jul. 2, 1991 [JP] Japan ................................. 3-161668

[51] Int. Cl.[5] .......................................... H01J 37/304
[52] U.S. Cl. ............................... 250/492.2; 250/491.1; 250/400
[58] Field of Search ............... 250/491.1, 492.2, 492.3, 250/548, 396 R, 397, 398, 492.1, 400; 355/53; 219/121.26, 121.3

[56] References Cited

U.S. PATENT DOCUMENTS

| | | | |
|---|---|---|---|
| 4,433,243 | 2/1984 | Nakamura et al. | 250/397 |
| 4,789,945 | 12/1988 | Niijima | 364/490 |
| 4,857,742 | 8/1989 | Kato et al. | 250/491.1 |
| 4,971,444 | 11/1990 | Kato | 356/375 |
| 5,047,647 | 9/1991 | Itoh et al. | 250/491.1 |

Primary Examiner—Jack I. Berman
Assistant Examiner—James Beyer
Attorney, Agent, or Firm—Staas & Halsey

[57] ABSTRACT

A charged particle beam exposure apparatus is provided with a source for irradiating a charged particle beam on an object which has a position detection mark provided thereon and is carried on a movable stage, a deflection part for deflecting the charged particle beam based on deflection signals, a first detection part for detecting the position detection mark of the object, a second detection part for detecting a stage position of the object and for outputting a position detection signal, a moving part for moving the stage which carries the object, and a control unit for controlling inputs and outputs of the source, the deflection part, the first and second detection parts and the moving part. The control unit corrects the deflection signals which are supplied to the deflection part so that the position detection mark is irradiated by the charged particle beam based on the position detection signal which is output from the second detection part and is related to the stage position of the object which is continuously moved by the moving part.

14 Claims, 12 Drawing Sheets

FIG. 1 PRIOR ART
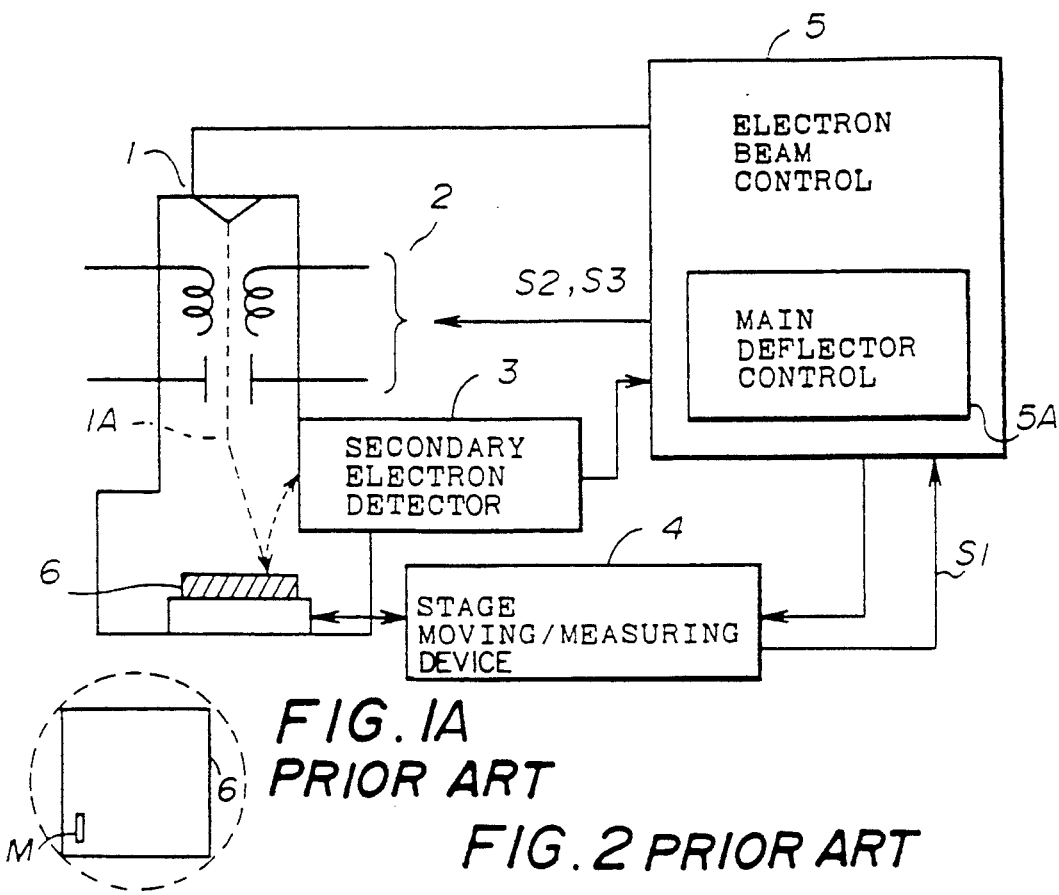
FIG. 1A PRIOR ART
FIG. 2 PRIOR ART
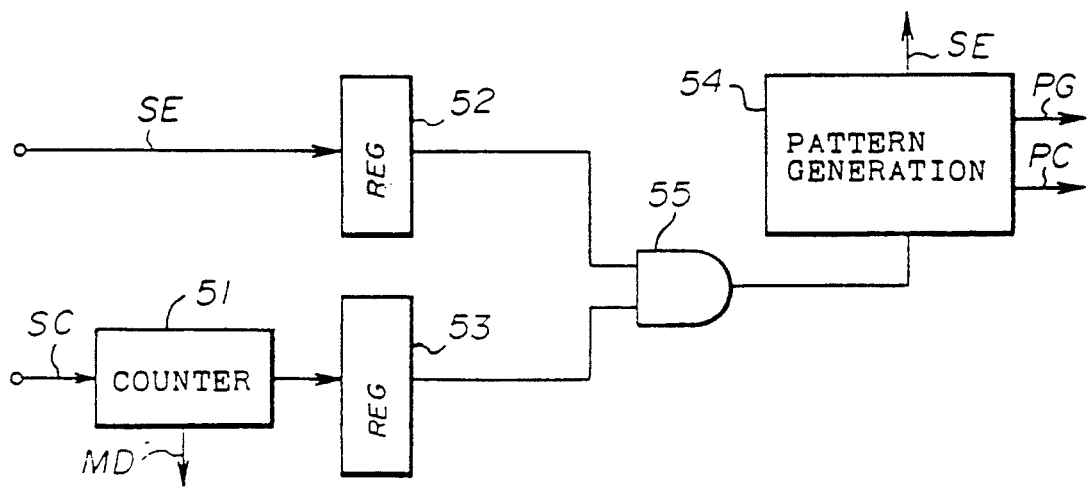

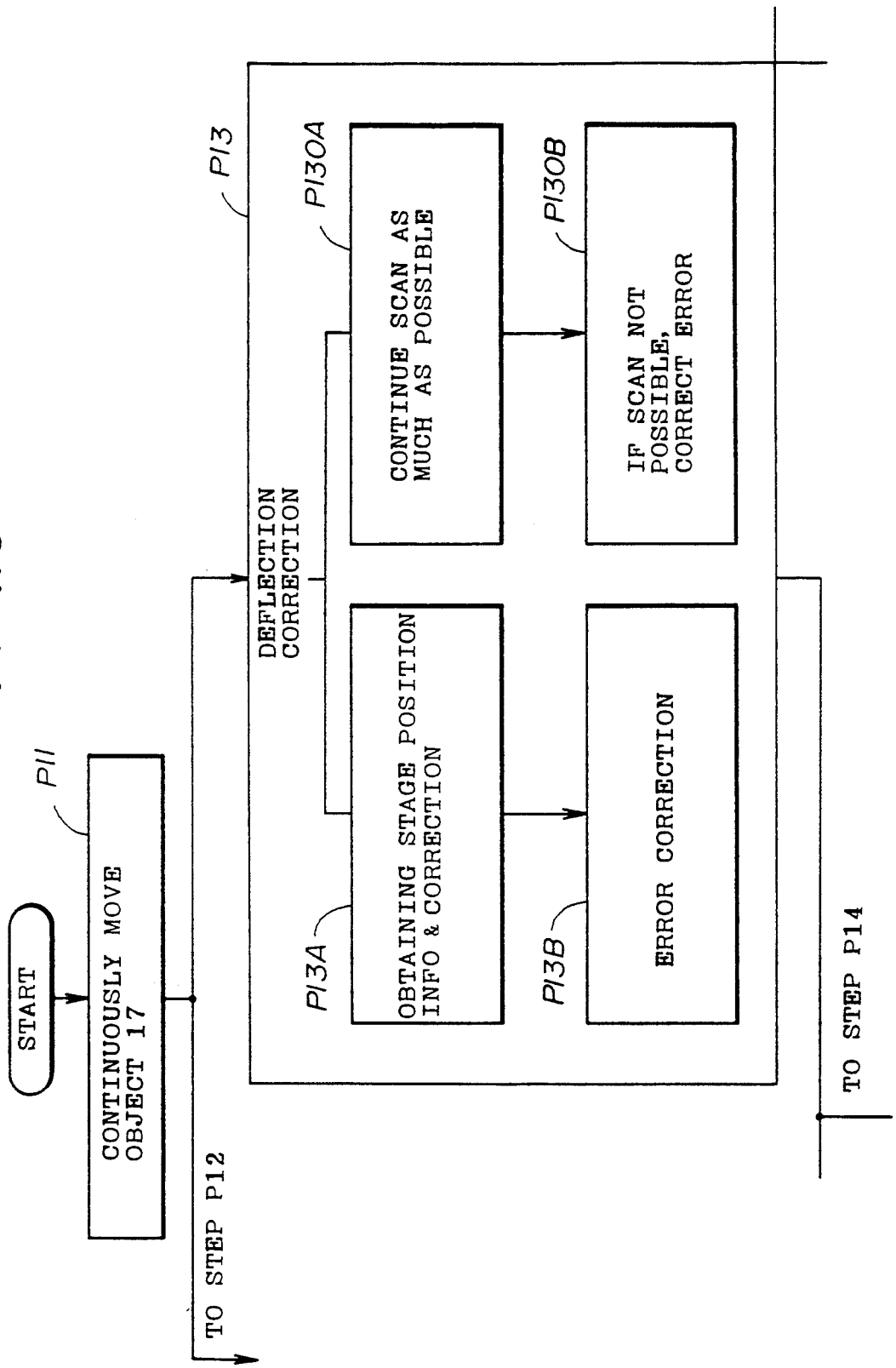

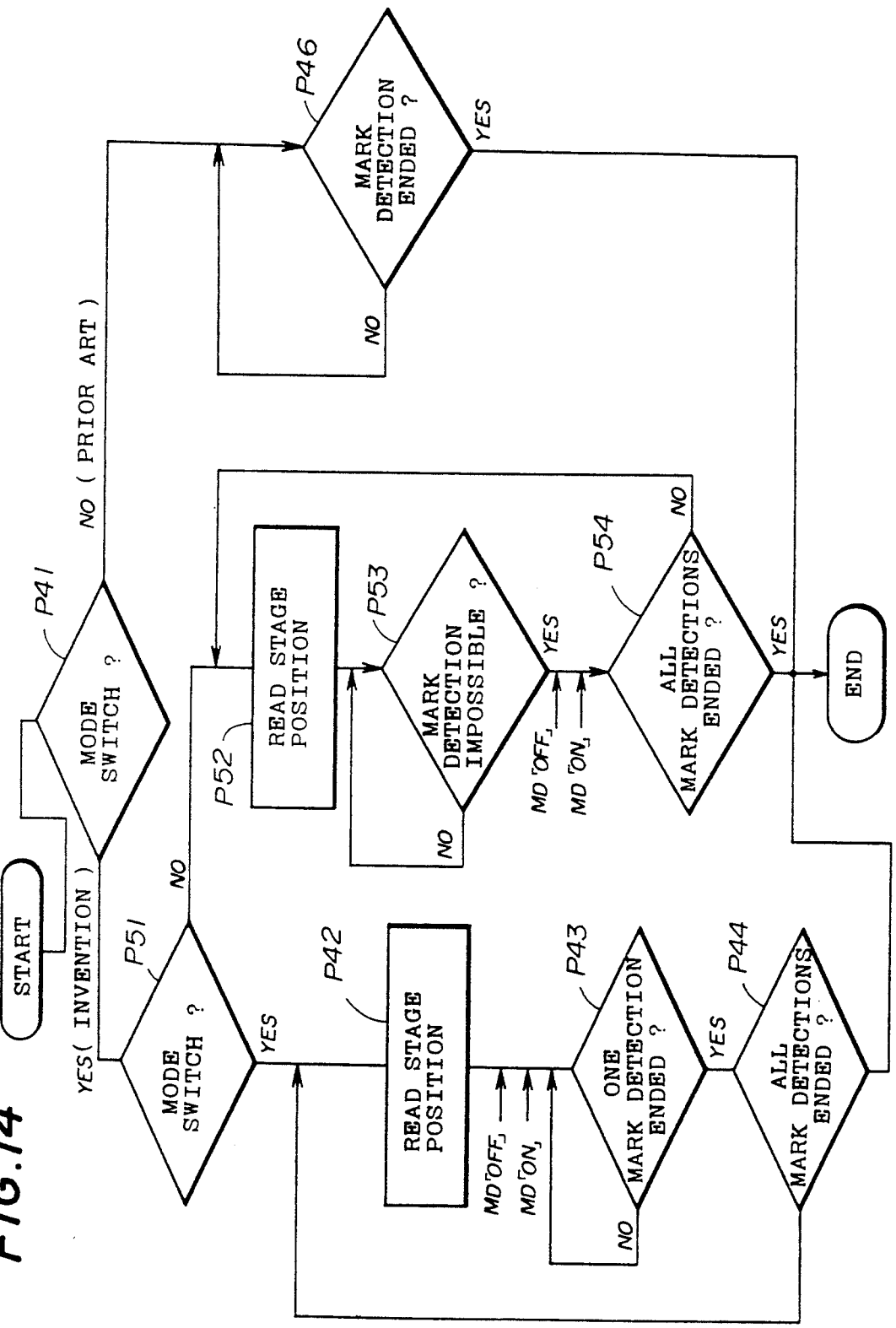

CORRECTION OF CHARGED PARTICLE BEAM EXPOSURE DEFLECTION BY DETECTING STAGE POSITION AND A POSITION DETECTION MARK

BACKGROUND OF THE INVENTION

The present invention generally relates to charged particle beam exposure apparatuses and methods of controlling charged particle beam exposure apparatuses, and more particularly to a charged particle beam exposure apparatus which has the function of detecting a position detection mark of a continuously moving object which is to be subjected to an irradiation when carrying out an exposure process or the like, and to a method of controlling such a charged particle beam exposure apparatus.

Recently, exposure apparatuses employing an electron beam or an ion beam are used when exposing fine patterns in order to produce semiconductor integrated circuit devices such as large scale integrated circuits (LSIs) which have many functions and a high integration density.

When detecting the position detection mark on a semiconductor wafer which continuously moves, a reference is made to a position detection signal which is output from a stage moving/measuring device only for a first beam scan when reading the stage position. For this reason, when the stage moving speed is increased, it becomes difficult to positively deflect the electron beam onto the position detection mark on the semiconductor wafer.

Accordingly, there is a demand to realize a charged particle beam exposure apparatus which reads the stage position of the object for every unit beam scan instead of only reading the stage position for the first beam scan, so as to detect the position detection mark by taking into consideration the stage moving speed and to improve the speed of the exposure process or the like.

FIGS. 1 and 2 show essential parts of an example of a conventional electron beam exposure apparatus. The electron beam exposure apparatus shown in FIG. 1 includes an electron gun 1, a deflector 2, a secondary electron detector 3, a stage moving/measuring device 4 and an electron beam control unit 5. For example, a semiconductor wafer 6 is the object which is to be subjected to the irradiation. The electron beam exposure apparatus detects a position detection mark M on the semiconductor wafer 6 which moves at an extremely slow speed or is stationary, and thereafter exposes an LSI pattern and the like in an exposure region of the semiconductor wafer 6. For example, the position detection mark M is a mark groove.

FIG. 2 shows the internal construction of a main deflector unit 5A of the electron beam exposure apparatus. The main deflector unit 5A generally includes a counter 51, registers 52 and 53, a 2-input logical product circuit (hereinafter simply referred to as an AND circuit) 55 and a pattern generation circuit 54.

When detecting the position detection mark M of the semiconductor wafer 6, a scan control signal SE is set in the register 52 of the main deflector unit 5A from a digital signal processor (DSP, not shown) or the like in a higher level. On the other hand, a beam scan number N is set in the counter 51 as a scan number signal SC from a central processing unit (CPU, not shown) or the like in the higher level. As a result, a number of times (beam scan number) an electron beam 1A scans the position detection mark M is counted down in the counter 51, for example, and a main deflector control signal MD which indicates the end of each scan is output from the counter 51 based on this number. In addition, the AND circuit 55 obtains the logical product of the scan control signal SE and the scan number signal SC respectively set in the registers 52 and 53, and supplies the logical product to the pattern generation circuit 54. The pattern generation circuit 54 generates the scan control signal SE, a pattern generation busy signal PG and a pattern generation count signal PC based on this logical product. The sub deflection data (shot data) is generated during a time in which both the signals PG and PC have a high level.

Accordingly, the electron beam 1A scans the position detection mark M based on the predetermined number N which is set from the CPU or the like, and the secondary electron detector 3 detects a secondary electron image related to the position detection mark M.

Next, a description will be given of the operation of detecting the position detection mark M of the semiconductor wafer 6 which continuously moves, by referring to the flow chart of FIG. 3. First, a step P1 carries out a process of continuously moving the stage, and a step P2 carries out a process of reading the stage position.

Then, a step P3 carries out a process of calculating an error between a target position of the stage control and an actual stage position, and a step P4 carries out a process of determining a final deflection coordinate related to an electromagnetic deflection.

A step P5 carries out a process of correcting the deflection signals S2 and S3 of the electron beam 1A, and a step P6 carries out a process of deflecting the electron beam 1A onto the position detection mark M.

A step P7 decides whether or not the mark detection is ended. The step P7 is continued if the decision result in the step P7 is NO. On the other hand, if the decision result in the step P7 is YES, the process advances to a step P8, for example. The step P8 carries out a process of exposing an LSI pattern or the like in the exposure region of the semiconductor wafer 6.

Conventionally, when detecting the position detection mark M of the semiconductor wafer 6 which continuously moves and the process of reading the stage position is carried out in the step P2, a reference is made to the position detection signal S1 which is output from the stage moving/measuring device 4 only for the first beam scan.

For this reason, if the stage moving speed is increased, there is a problem in that it is difficult to positively deflect the electron beam 1A onto the position detection mark M of the semiconductor wafer 6 as shown in FIG. 4.

FIG. 4 is a timing chart for explaining the problems of the conventional apparatus described above. As shown in FIG. 4, when the stage moving speed is extremely slow or the stage is stationary, the process of detecting the position detection mark M can follow the moving stage within a range A in which the electron beam 1A can be deflected. However, if the stage moving speed is increased in order to speed up the exposure process, the stage may exceed the range A and fall within a range B in which no drawing by the electron beam 1A is possible. As a result, a control error is generated.

It may be regarded that the error is introduced in the deflection control of the electron beam 1A because the output timings of a main deflection blanking signal LB and a sub deflection blanking signal SB are determined by referring to the position detection signal S1 which is output from the stage moving/measuring device 4 only for the first beam scan by taking the stage position which is read the first time as the reference and no consideration is given as to the stage moving speed thereafter. Hence, even though the sub deflection blanking signal SB has a high level, it is difficult to positively deflect the electron beam 1A on the position detection mark M.

For example, if the number of going and returning shots of the electron beam 1A on the position detection mark M per unit scan is 400 and the exposure time per shot is 5 $\mu$s, the time required per unit scan is 2 ms. In addition, the time required is 16 times and 32 ms if the scan is made 16 times.

Accordingly, if it is assumed that the stage is moving at 1 mm/s and the resolution of the stage position coordinate is 0.01 $\mu$m, for example, a set pulse dependent on 0.1M scan control signals SE is repeated. In other words, the set pulse rises once in 10 ns.

For this reason, if the margin width of the sub deflection region is set to $\pm 10$ $\mu$m, for example, the position detection operation is delayed and the range in which the drawing can be made on the stage is exceeded even when the stage moving speed is 1 mm/s, as is evident by comparing the time of 20 ms required for the stage to move a distance of 20 $\mu$m and the time of 32 ms required for the electron beam 1A to scan the position detection mark M 16 times by the going and returning scan.

SUMMARY OF THE INVENTION

Accordingly, it is a general object of the present invention to provide a novel and useful charged particle beam exposure apparatus and a method of controlling charged particle beam exposure apparatus, in which the problems described above are eliminated.

Another and more specific object of the present invention is to provide a charged particle beam exposure apparatus comprising a source for irradiating a charged particle beam on an object which has a position detection mark provided thereon and is carried on a movable stage, deflection means for deflecting the charged particle beam based on deflection signals, first detection means for detecting the position detection mark of the object, second detection means for detecting a stage position of the object and for outputting a position detection signal, moving means for moving the stage which carries the object, and control means for controlling inputs and outputs of the source, the deflection means, the first and second detection means and the moving means, where the control means includes means for correcting the deflection signals which are supplied to the deflection means so that the position detection mark is irradiated by the charged particle beam based on the position detection signal which is output from the second detection means and is related to the stage position of the object which is continuously moved by the moving means. According to the charged particle beam exposure apparatus of the present invention, it is possible to positively deflect the charged particle beam onto the position detection mark of the object even if the moving speed of the object is increased.

Still another object of the present invention is to provide a method of controlling a charged particle beam exposure apparatus which irradiates a charged particle beam on an object which has a position detection mark provided thereon and is carried on a movable stage, comprising the steps of (a) continuously moving the stage so as to move the object, (b) deflecting the charged particle beam onto the position detection mark of the object, (c) detecting a stage position of the object and correcting the deflection of the charged particle beam depending on the detected stage position, and (d) detecting the position detection mark of the object by the charged particle beam the deflection of which is corrected by the step (c). According to the method of the present invention, it is possible to accurately detect the position detection mark of the object, and the position detection operation can sufficiently follow the speed of the moving object. In addition, the range in which the charged particle beam is deflectable can be set within a range in which the drawing is possible, such as the exposure region of the object.

Other objects and further features of the present invention will be apparent from the following detailed description when read in conjunction with the accompanying drawings.

BRIEF DESCRIPTION OF THE DRAWINGS

FIG. 1 is a system block diagram showing an essential part of an example of a conventional electron beam exposure apparatus;

FIG. 1A showing a plan view of a semiconductor wafer;

FIG. 2 is a system block diagram showing another essential part of the conventional electron beam exposure apparatus;

FIG. 13 is a flow chart for explaining the operating principle of a second embodiment of the present invention; and FIG. 14 is a flow chart for explaining a stage position read control operation of the second embodiment of the electron beam exposure apparatus.

DESCRIPTION OF THE PREFERRED EMBODIMENTS

First, a description will be given of the operating principle of a first embodiment of the present invention by referring to FIGS. 5 and 6.

Figures 5, 5A:
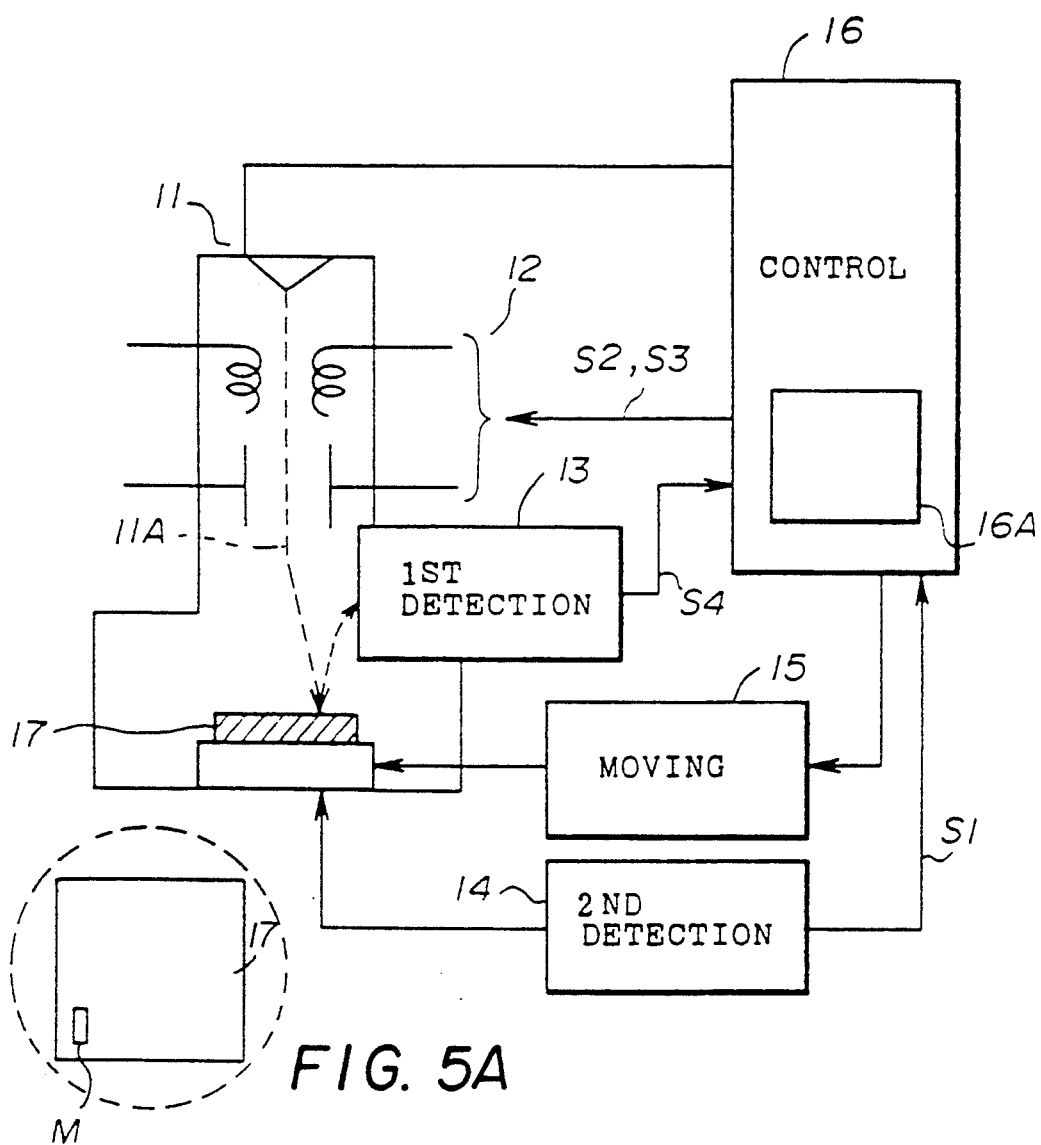
FIG. 5 is a system block diagram for explaining the operating principle of a first embodiment of the present invention.
FIG. 5A shows a plan view of a semiconductor wafer.

The first embodiment of a charged particle beam exposure apparatus according to the present invention shown in FIG. 5 includes a charged particle generation source 11 for irradiating a charged particle beam 11A on an object 17, a deflection means 12 for deflecting the charged particle beam 11A, a first detection means 13 for detecting a position detection mark M which is provided on the object 17, a second detection means 14 for detecting a stage position of the object 17, a moving means 15 for moving the object 17, and a control means 16 for controlling inputs and outputs of the charged particle beam generation source 11, the deflection means 12, the first and second detection means 13 and 14, and the moving means 15. In this embodiment, the control means 16 corrects deflection signals S2 and S3 which are supplied to the deflection means 12 based on a position detection signal S1 which is related to the stage position of the object 17 which continuously moves.

The control means 16 may include a detection drive control means 16A. The detection drive control means 16A re-determines a final detection coordinate of the charged particle beam 11A based on the position detection signal S1 which is related to the stage position of the object 17 obtained for every unit going and returning scan of the charged particle beam 11A with respect to the position detection mark M.

The final deflection coordinate related to the electromagnetic deflection and electrostatic deflection of the charged particle beam 11A may be determined every time depending on the number of scans of the charged particle beam 11A.

Figure 6:
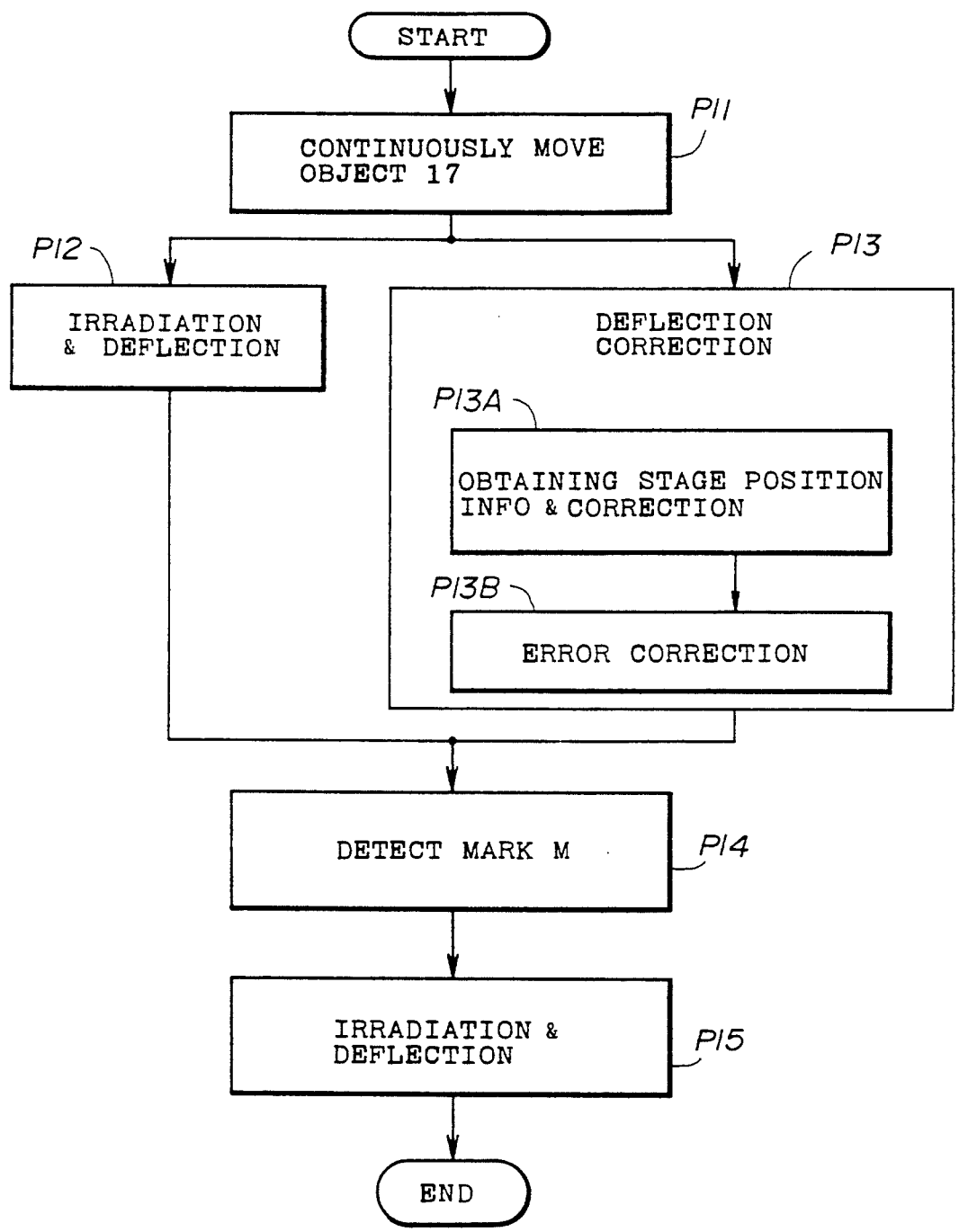
FIG. 6 is a flow chart for explaining the operating principle of the first embodiment of the present invention.

A method of controlling charged particle beam exposure apparatus according to the present invention is carried out as shown in FIG. 6.

In FIG. 6, a step P11 carries out a process of continuously moving the object 17 under an irradiation and deflection region of the charged particle beam 11A, and a step P12 carries out a process of irradiating and deflecting the charged particle beam 11A onto the position detection mark M of the object 17. A step P13 carries out a process of detecting the stage position of the object 17 and a process of correcting the deflection of the charged particle beam 11A. Thereafter, a step P14 carries out a process of detecting the position detection mark M of the object 17 based on the deflection correction process of the step P13.

In addition, in the step P13, a step P13A carries out a process of obtaining the stage position information related to the object 17 for every unit going and returning scan of the charged particle beam 11A with respect to the position detection mark M. Thereafter, a step P13B carries out a process of correcting an error between a control target position of the position detection mark M and an actual moved position based on the above stage position information.

When controlling the charged particle beam exposure apparatus, it is possible to carry out a process of switching the mode. More particularly, it is possible to select the mode in which the process of obtaining the stage information of the object 17 for every unit going and returning scan of the charged particle beam 11A with respect to the position detection mark M is carried out or, the mode in which the process of obtaining the stage position information only once regardless of the unit going and returning scan of the charged particle beam 11A.

In addition, when carrying out the process of obtaining the stage position information only once regardless of the unit going and returning scan of the charged particle beam 11A with respect to the position detection mark M, the charged particle beam 11A may be deflected to successively scan the position detection mark M several times.

After carrying out the process of detecting the position detection mark M of the object 17 which continuously moves, a step P15 carries out a process of irradiating and deflecting the charged particle beam onto the exposure region of the object 17.

According to this embodiment of the charged particle beam exposure apparatus according to the present invention, when the object 17 is continuously moved by the moving means 15, the charged particle beam 11A which is irradiated from the charged particle generation source 11 towards the object 17 is deflected by the deflection means 12. In addition, the first detection means 13 detects the position detection mark M which is provided on the object 17. In this state, the stage position of the object 17 is detected by the second detection means 14, and the position detection signal S1 related to this stage position is output to the control means 16. The control means corrects the deflection signals S2 and S3 which are supplied to the deflection means 12 based on the position detection signal S1 which is related to the stage position of the object 17 which continuously moves.

Therefore, even if the moving speed of the object 17 increases, the deflection drive control means 16A of the control means 16 re-determines the final deflection coordinate of the charged particle beam 11A based on the position detection signal S1 which is related to the stage position of the object 17 and is obtained for every unit going and returning scan of the charged particle beam 11A with respect to the position detection mark M which moves every moment. In addition, the final deflection coordinate related to the electromagnetic deflection and electrostatic deflection of the charged particle beam 11A is determined every time depending on the number of scans of the charged particle beam 11A.

As a result, it is possible to positively deflect the charged particle beam 11A onto the position detection mark M of the object 17 even if the moving speed of the object 17 is increased and becomes relatively fast.

On the other hand, according to the method of controlling the charged particle beam exposure apparatus according to the present invention shown in FIG. 6, the step P12 carries out the process of irradiating and deflecting the charged particle beam 11A onto the position detection mark M of the object 17, and the step P13 carries out the processes of detecting the stage position of the object 17 and correcting the deflection of the charged particle beam 11A. For this reason, the step P13A carries out the process of obtaining the stage position information of the object 17 for every unit going and returning scan of the charged particle beam 11A with respect to the position detection mark M, and thereafter, the step P13B carries out the process of correcting the error between the control target position of the position detection mark M and the actual moved position based on the stage position information. Hence, compared to the conventional method, it is possible to accurately carry out the process of detecting the position detection mark M of the object 17 based on the deflection correction process of the step P14 which takes into consideration the stage moving speed.

Therefore, even if the moving speed of the object 17 increases, the position detection operation can sufficiently follow the moving object 17, and the charged particle beam 11A will not enter the range B in which the drawing is impossible. Moreover, it is possible to set the range in which the charged particle beam 11A can be deflected within the range in which the drawing is possible such as the exposure region of the object 17.

Thus, the conventional process of detecting the position detection mark M and the process of detecting the position detection mark M according to this embodiment can be carried out selectively. As a result, the process of detecting the position detection mark M can be selected depending on whether the moving speed of the object 17 is fast or slow.

For example, if the moving speed of the object 17 is slow or the object 17 is stationary, the process of detecting the position detection mark M is carried out within the range in which the sub deflection of the charged particle beam 11A is possible, as is done conventionally. Hence, the charged particle beam 11A is continuously deflected and scans the position detection mark M several times.

On the other hand, the speed of the exposure process and the like can be increased because the step P15 carries out the process of irradiating and deflecting the charged particle beam 11A in the exposure region of the object 17 which continuously moves.

Accordingly, it is possible to realize exposure apparatuses such as an electron beam exposure apparatus which carries out the exposure process at a high speed with respect to the object 17 which continuously moves while confirming the position detection mark M, and an electron beam apparatus which obtains and processes the image to be drawn by such an electron beam exposure apparatus.

Next, a description will be given of the first embodiment of the charged particle beam exposure apparatus according to the present invention, by referring to FIGS. 7 through 9. In this embodiment, the present invention is applied to an electron beam exposure apparatus.

Figure 7:
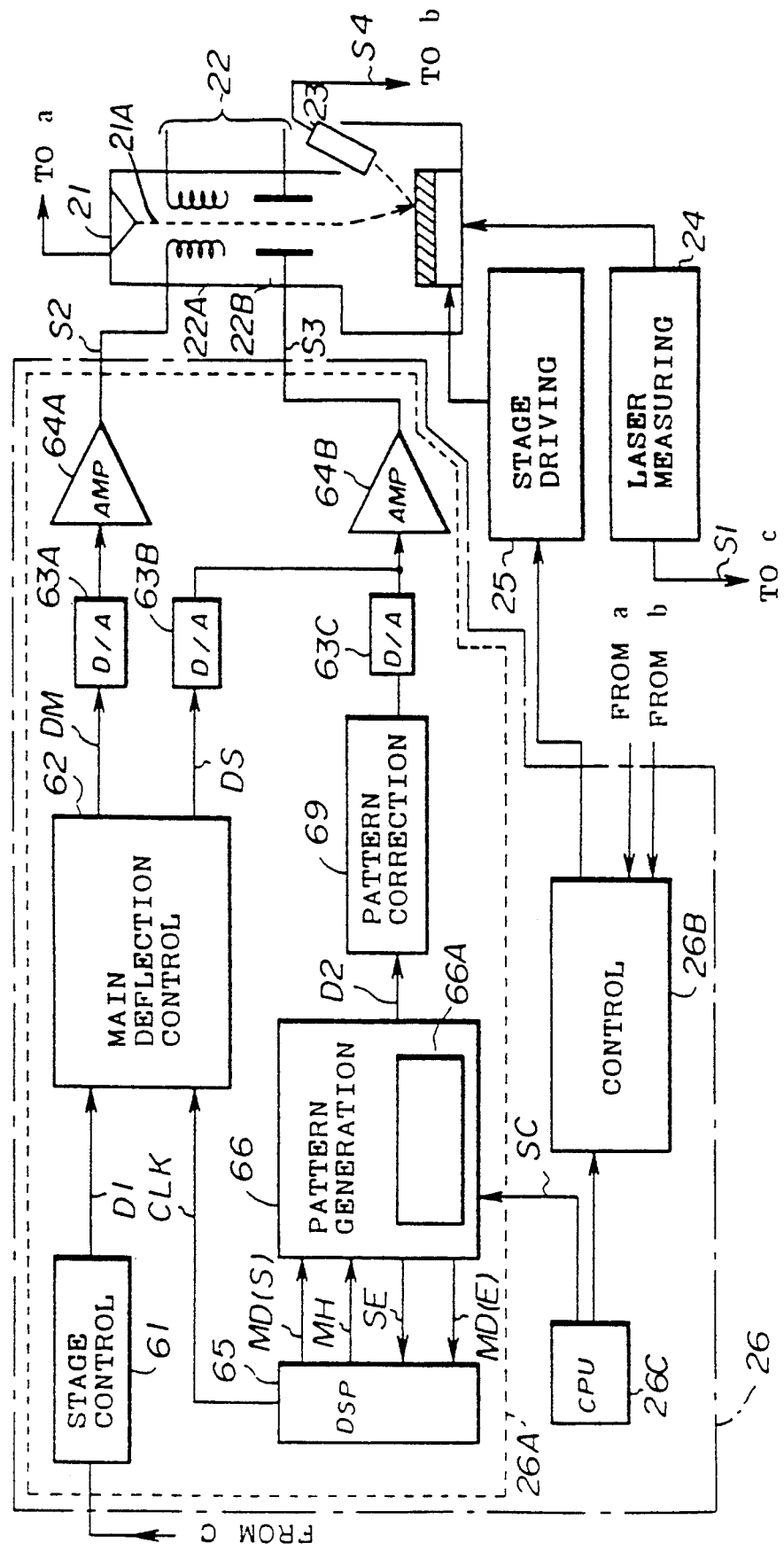
FIG. 7 is a system block diagram showing an essential part of the first embodiment of a charged particle beam exposure apparatus according to the present invention.

An electron beam exposure apparatus shown in FIG. 7 includes an electron gun 21, a deflector 22, a secondary electron detector 23, a laser measuring equipment 24, a stage driving device 25 and an electron beam control unit 26.

The electron gun 21 is an embodiment of the charged particle generation source 11, and irradiates an electron beam 21A which corresponds to the charged particle beam 11A onto a semiconductor wafer 27 which corresponds to the object 17.

The deflector 22 is an embodiment of the deflection means 12. The deflector 22 is made up of an electromagnetic deflector 22A which subjects the electron beam 21A to a large (main) deflection, and an electrostatic deflector 22B which subjects the electron beam 21A to a small (sub) deflection. For example, the deflector 22 is driven and controlled by the electromagnetic deflection signal S2 and the electrostatic deflection signal S3 which are output from the electron beam control unit 26.

The secondary electron detector 23 is an embodiment of the first detection means 13. The secondary electron detector 23 detects a mark groove (hereinafter referred to as the position detection mark M) which is provided on the semiconductor wafer 27 by detecting the secondary electrons which are reflected by the position detection mark M when the electron beam 21A is irradiated on the position detection mark M. The electron beam control unit 26 recognizes the position detection mark M by carrying out a signal processing on a mark detection signal S4 which is output from the secondary electron detector 23.

The laser measuring equipment 24 is an embodiment of the second detection means 14. The laser measuring equipment 14 detects the stage position of the semiconductor wafer 27, and outputs to the electron beam control unit 26 a position detection signal S1 which changes every moment.

The stage driving device 25 is an embodiment of the moving means 15, and continuously moves the semiconductor wafer 27. For example, the stage driving device 25 moves the stage on which the semiconductor wafer 27 is placed at a speed of 1 to 10 mm/s.

The electron beam control unit 26 is an embodiment of the control means 16. The electron beam control unit 26 is made up of a deflection drive control unit 26A, a control unit 26B and a CPU 26C. The deflection drive control unit 26A includes a stage control circuit 61, a main deflection control circuit 62, digital-to-analog (D/A) converters 63A through 63C, deflection amplifiers 64A and 64B, a DSP 65, a pattern generation circuit 66 and a pattern correction circuit 67.

The stage control circuit 61 outputs a stage position data D1 to the main deflection control circuit 62. The main deflection control circuit 62 outputs a main deflection data DM and a sub deflection data DS to the respective D/A converters 63A and 63B based on the stage position data D1 and a stage position read clock CLK.

The D/A converters 63A and 63B respectively subject the main deflection data DM and the sub deflection data DS to a D/A conversion, and output converted analog signals to the respective deflection amplifiers 64A and 64B. The deflection amplifiers 64A and 64B amplify the converted analog signals, and output the main deflection signal S2 and the sub deflection signal S3 to the deflector 22.

The DSP 65 outputs the stage position read clock CLK, a main deflection control (start) signal MD(S) and a main deflection hold signal MH based on a scan control signal SE and a main deflection control signal MD (E).

The pattern generation circuit 66 outputs shot data D2 to the pattern correction circuit 67 based on a scan number signal SC, the main deflection control (start) signal MD (S) and the main deflection hold signal MH. The pattern correction circuit 67 carries out a pattern correction on the shot data D2. For example, the correction circuit 67 re-determines the final deflection coordinate of the electron beam 21A based on the position detection signal S1 which is related to the stage position of the semiconductor wafer 27 obtained for every unit going and returning scan of the electron beam 21A with respect to the position detection mark M. In addition, the correction circuit 67 determines the final deflection coordinate of the electron beam 21A related to the electromagnetic deflection and the electrostatic deflection every time depending on a scan number N of the electron beam 21A.

The control unit 26B controls the inputs and outputs of the stage driving device 25, the electron gun 21 and the like. The CPU 26C controls the inputs and outputs of the control unit 26B and the deflection drive control unit 26A. For example, the CPU 26C outputs a scan number signal SC which sets a scan number value of the electron beam 21A in a main deflection control unit 66A within the pattern generation circuit 66.

Figure 8:
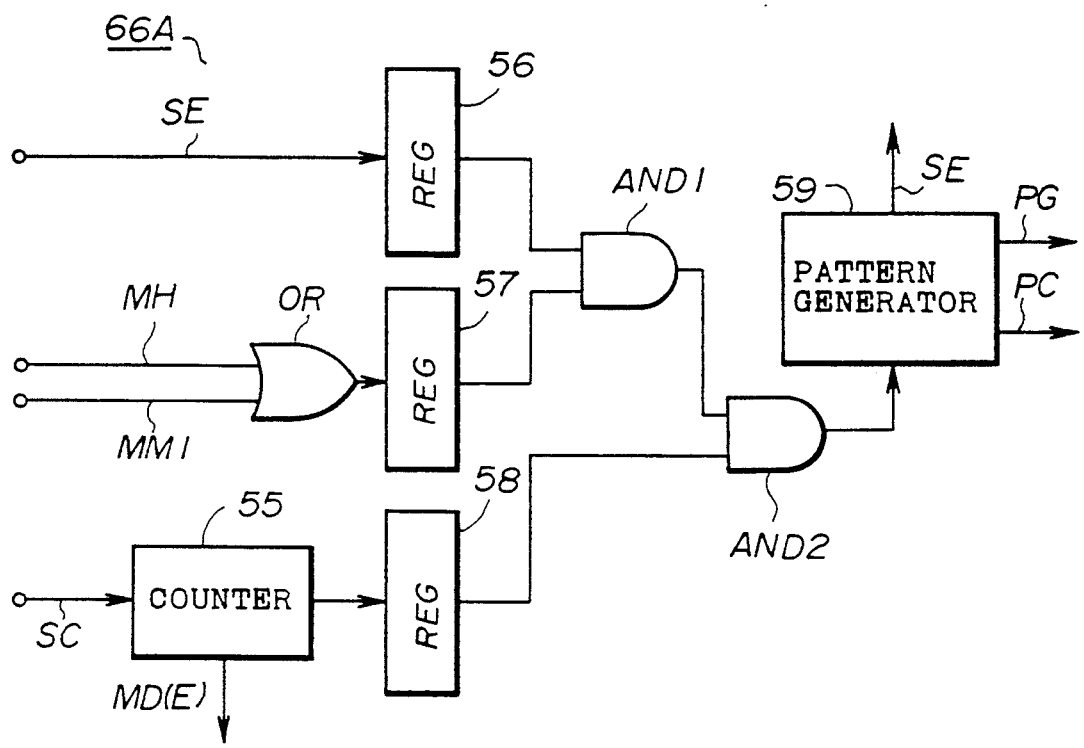
FIG. 8 is a system block diagram showing a main deflection control unit of the first embodiment shown in FIG. 7.
Figure 9:
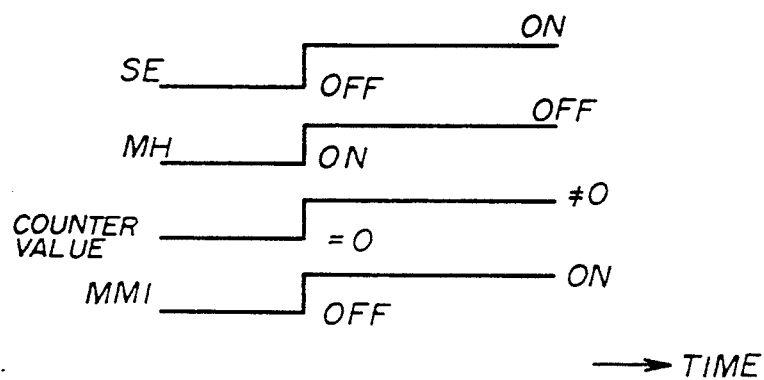
FIG. 9 is a timing chart for explaining the operation of the deflection control unit shown in FIG. 8.

FIG. 8 shows an embodiment of the main deflection control unit 66A, and FIG. 9 is a timing chart for explaining the operation of this main deflection control unit 66A.

In FIG. 8, the main deflection control unit 66A provided within the pattern generation circuit 66 includes a counter 55, first through third registers 56 through 58, a 2-input logical sum circuit (OR circuit) OR, first and second 2-input logical product circuits (AND circuits) AND1 and AND2, and a pattern generator 59.

The counter 55 counts down the scan number value which is set therein from the CPU 26C by the scan number signal SC, and outputs the main deflection control signal MD (E) when the count ends. The first register 56 is set with the scan control signal SE. In addition, the OR circuit OR obtains the OR of a mode switching signal MM1 which selects the stage position read mode and the main deflection hold signal MH which holds the deflection operation of the main deflector 22A, and changes the process of detecting the position detection mark M in the apparatus. The second register 57 holds the stage position read mode, and the third register 58 holds a counter output value of the counter 55.

The AND circuit AND1 obtains the AND of output values of the first and second registers 56 and 57, and the AND circuit AND2 obtains an AND of output values of the AND circuit AND1 and the third register 58. The pattern generator 59 outputs the scan control signal SE, a pattern generation busy signal PG and a pattern generation count signal PC based on an output value of the AND circuit AND2.

From FIG. 9, it may be seen that the functions of the main deflection control unit 66A is quite different from those of the conventional apparatus. More particularly, the main deflection control unit 66A generates the shot data D2 based on four control signals. For example, when detecting the position detection mark M of the semiconductor wafer 27, each deflector becomes ON when the scan control signal SE output from the DSP 65 has a high level. This scan control signal SE is set in the first register 56. In addition, when the main deflection hold signal MH has a high level, each deflector becomes OFF and temporarily stops the deflection operation. This main deflection hold signal MH is input to the OR circuit OR.

Furthermore, when the mode switching signal MM1 has a high level, the position detection process of the present invention is carried out. On the other hand, the conventional position detection process is carried out when the mode switching signal MM1 has a low level. In other words, when carrying out the process of obtaining the stage position information related to the semiconductor wafer 27 for every unit going and returning scan of the electron beam 21A with respect to the position detection mark M, the mode switching signal MM1 is set to the high level. On the other hand, when carrying out the process of obtaining the stage position information only once regardless of the unit going and returning scan of the electron beam 21A, the mode switching signal MM1 is set to the low level.

If the counter output of the counter 55 (that is, the scan number) is zero, a main deflection control (end) signal MD having a low level is output from the counter 55. This main deflection control (end) signal MD has a high level if the scan number is not zero. The main deflection control (end) signal MD is input to the DSP 65.

Accordingly, the deflection drive control unit 26A can correct the main deflection signal S2 and the sub deflection signal S3 which are supplied to the deflector 22 based on the position detection signal S1 which is related to the stage position of the semiconductor wafer 27 which continuously moves.

This embodiment of the electron beam exposure apparatus is provided with the electron gun 21, the deflector 22, the secondary electron detector 23, the laser measuring equipment 24, the stage driving device 25 and the electron beam control unit 26 as shown in FIG. 7. And, the electron beam control unit 26 corrects the main deflection signal S2 and the sub deflection signal S3 which are supplied to the electromagnetic deflector 22A and the electrostatic deflector 22B based on the position detection signal S1 which is related to the stage position of the semiconductor wafer 27 which continuously moves.

For example, if the semiconductor wafer 27 is continuously moved by the stage driving device 25, the electron beam 21A which is irradiated from the electron gun 21 towards the semiconductor wafer 27 is deflected by the deflector 22. In addition, the position detection mark M provided on the semiconductor wafer 27 is detected by the secondary electron detector 23.

As a result, the stage position of the semiconductor wafer 27 is detected by the laser measuring equipment 24, and the position detection signal S1 related to the stage position is output to the stage control circuit 61 and the like of the electron beam control unit 26. Hence, in the deflection drive control unit 26A, the main deflection signal S2 and the sub deflection signal S3 which are supplied to the deflector 22 are corrected based on the position detection signal S1 which is related to the stage position of the semiconductor wafer 27 which continuously moves.

Therefore, even when there is a request to increase the moving speed of the semiconductor wafer 27, the deflection drive control unit 26A re-determines the final deflection coordinate of the electron beam based on the position detection signal S1 which is related to the stage position of the semiconductor wafer 27 obtained for every unit going and returning scan of the electron beam 21A with respect to the position detection mark M. Furthermore, the final deflection coordinate related to the electromagnetic deflection and the electrostatic deflection of the electron beam 21A is determined every time depending on the scan number N of the electron beam 21A.

Accordingly, it is possible to positively deflect the electron beam 21A on the position detection mark M of the semiconductor wafer 27 even if there is a request to move the semiconductor wafer 27 at a high speed.

Next, a description will be given of the first embodiment of a method of controlling the charged particle beam exposure apparatus according to the present invention, in conjunction with additional description related to the operation of the electron beam exposure apparatus. In this embodiment of the method, the present invention is also applied to the electron beam exposure apparatus.

Figure 10:
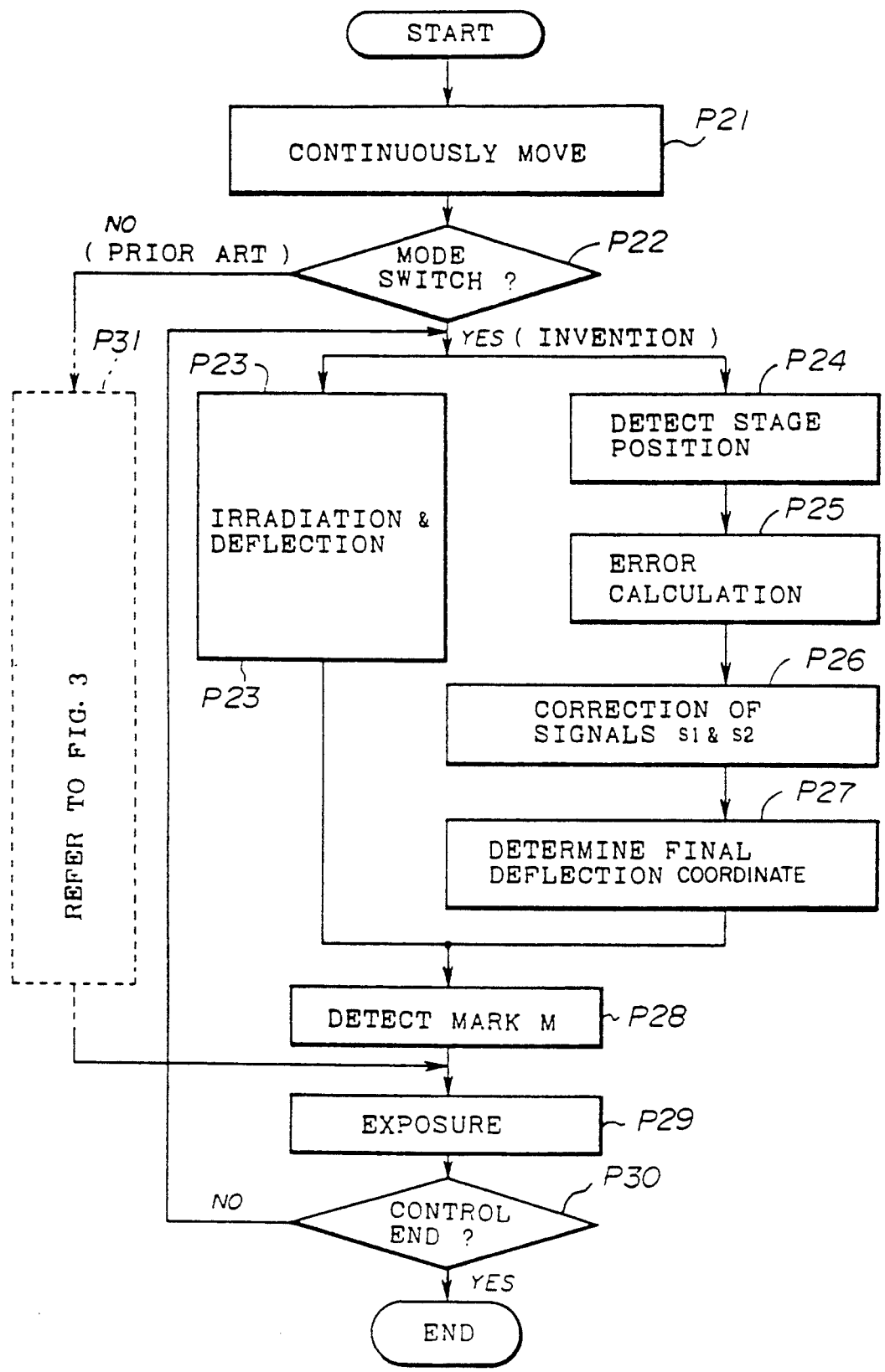
FIG. 10 is a flow chart for explaining an exposure control operation of the electron beam exposure apparatus, for the purpose of explaining a first embodiment of a method of controlling the charged particle beam exposure apparatus according to the present invention.
Figure 11:
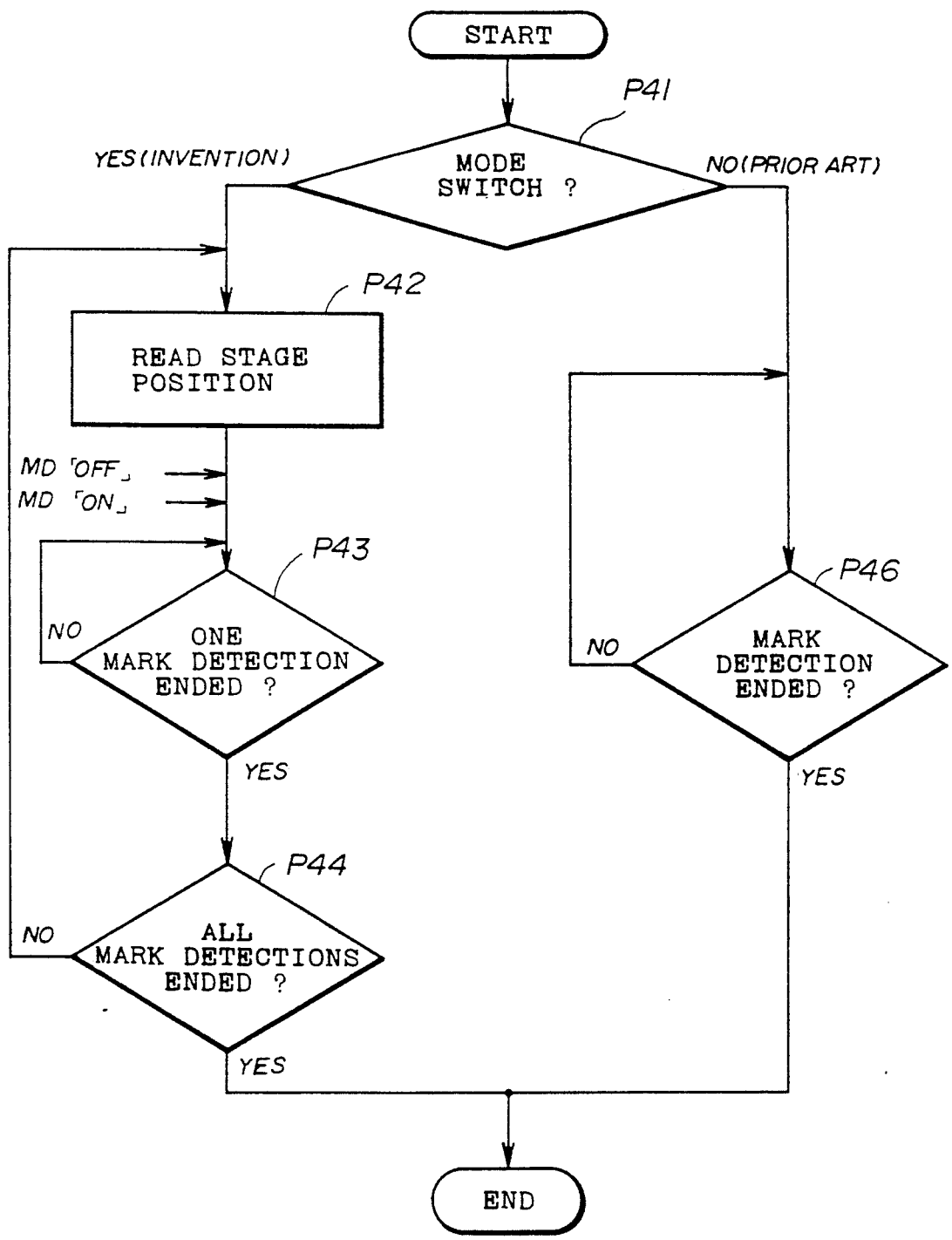
FIG. 11 is a flow chart for explaining a stage position read control operation of the first embodiment of the electron beam exposure apparatus.
Figure 12:
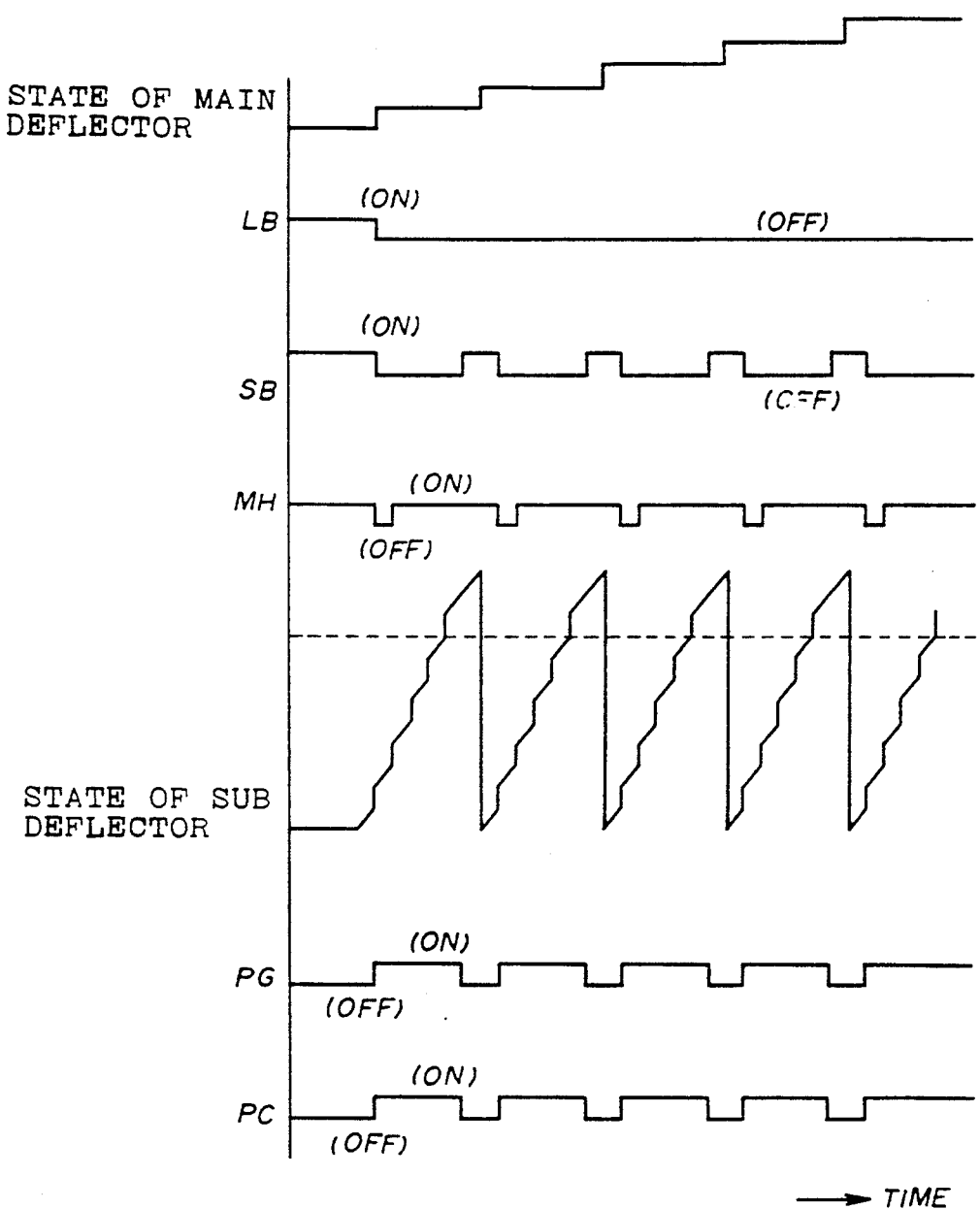
FIG. 12 is a timing chart for explaining the first embodiment of the method.

FIG. 10 is a flow chart for explaining an exposure control operation of the electron beam exposure apparatus, and FIG. 11 is a flow chart for explaining a stage position read control operation of the electron beam exposure apparatus. The processes of FIGS. 10 and 11 are carried out by the DSP 65 shown in FIG. 7. FIG. 12 is a timing chart for explaining this embodiment of the method.

For example, when continuously exposing an LSI pattern or the like on the semiconductor wafer 27 while detecting the position detection mark M shown within a phantom circle in FIG. 5, a step P21 in FIG. 10 starts a process of continuously moving the semiconductor wafer 27 under the irradiation and deflection region of the electron beam 21A. In this case, the stage which carries the semiconductor wafer 27 is moved at a speed of 1 to 10 mm/s by the stage driving device 25.

Next, a step P22 switches the mode related to the position detection process. For example, te mode is switched based on information received from the CPU 26C shown in FIG. 7. The stage position read mode which is preset by the user is read from a register or the like. For example, when selecting this embodiment of the method and the decision result in the step P22 is YES, steps P23 and P24 are carried out. The process of detecting the position detection mark M according to this embodiment is selected by the OR of the mode switching signal MM1 and the main deflection hold signal MH obtained by the OR circuit OR within the main deflection control unit 66A.

Figure 3:
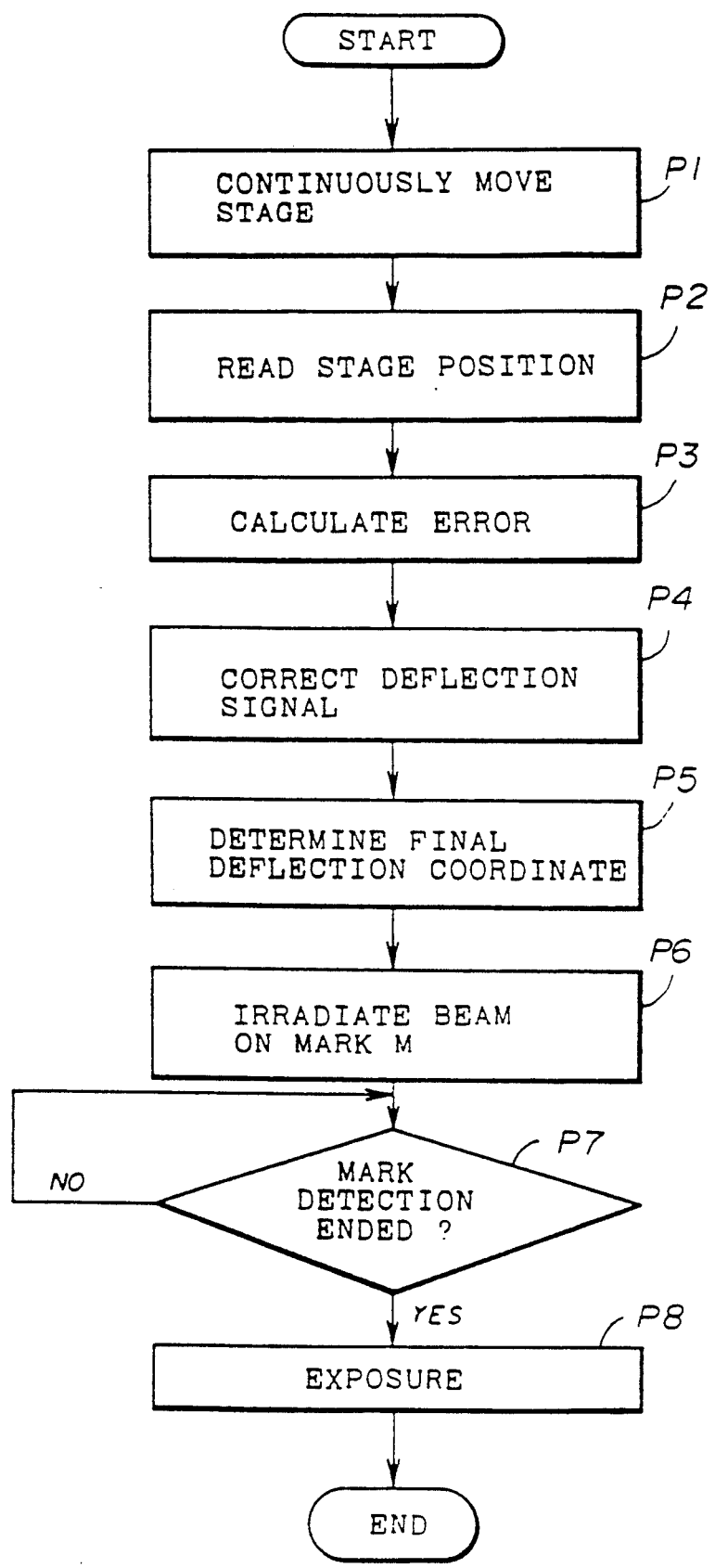
FIG. 3 is a flow chart for explaining the operation of the conventional electron beam exposure apparatus.
Figure 4:
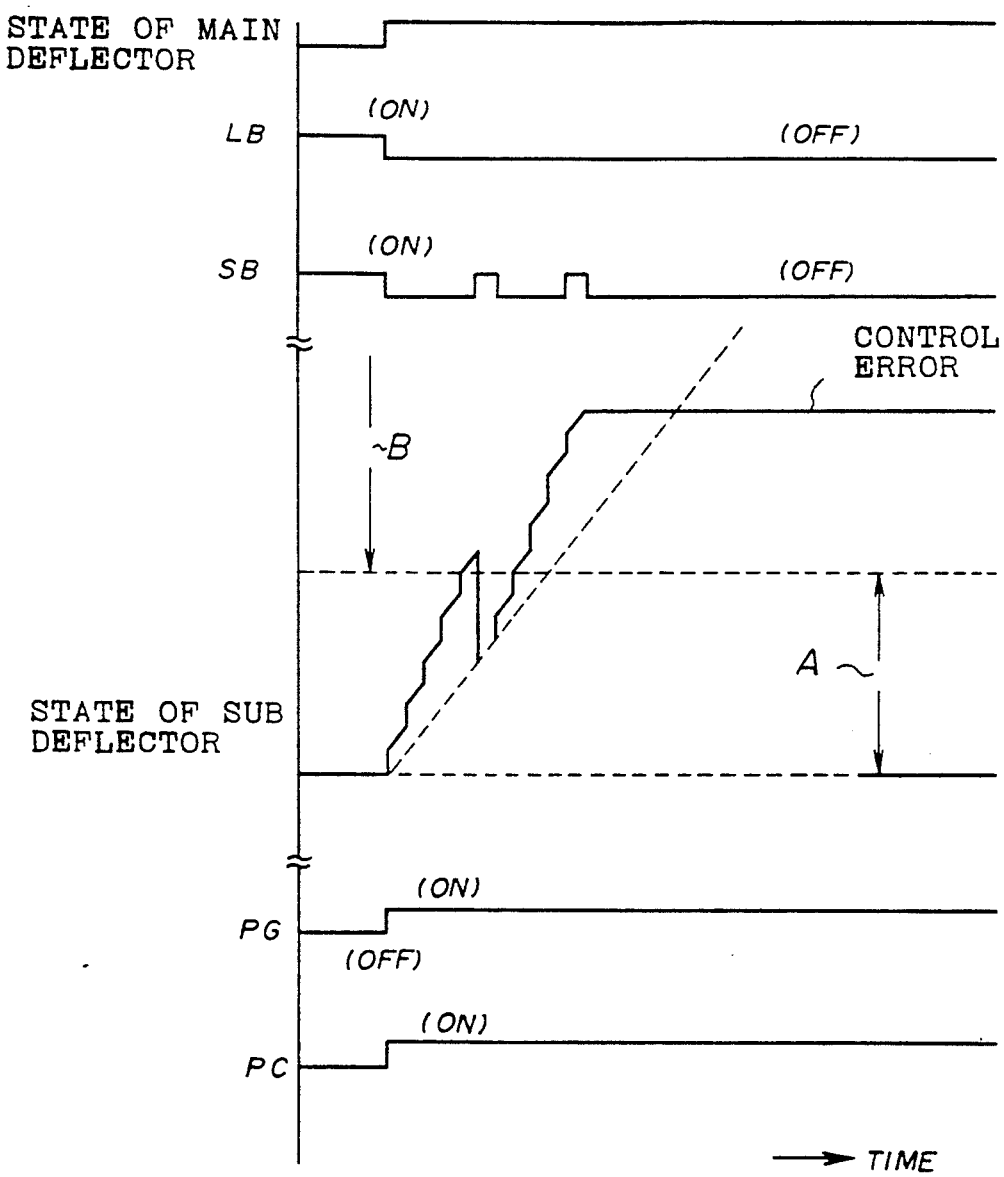
FIG. 4 is a timing chart for explaining the problems of the conventional electron beam exposure apparatus.

When selecting the conventional method, the decision result in the step P22 is NO and the process advances to a step P31 to carry out the process shown in FIG. 3. If this conventional method is selected, the electron beam 21A is continuously deflected and scans the position detection mark M several times.

Accordingly, if the stage position read mode according to this embodiment is selected, the step P23 carries out a process of irradiating and deflecting the electron beam 21A onto the position detection mark M. In this case, the electron beam 21A from the electron gun 21 is irradiated towards the semiconductor wafer 27, and as shown in FIG. 12, the main blanking signal LB is in the OFF state and the sub blanking signal LB repeats the ON/OFF state based on the main deflection control signal MD.

As a result, the electron beam 21A is subjected to a large (main) deflection by the electromagnetic deflector 22A as shown in FIG. 12 based on the electromagnetic deflection signal S2. On the other hand, the electron beam 21A is subjected to a small (sub) deflection by the electrostatic deflector 22B as shown in FIG. 12 based on the electrostatie deflection signal S3.

At the same time, a step P24 carries out a process of detecting the stage position of the semiconductor wafer 27. As may be seen from FIG. 11, when the stage position read mode according to this embodiment is selected and the decision result in the step P41 is YES, a step P42 carries out a process of reading the stage position and the operation of detecting the position detection mark M is started. A step P43 decides whether or not one mark detection is ended, and a step P44 decides whether or not all mark detections are ended. The step P44 is carried out if the decision result in the step P43 becomes YES. The process returns to the step P42 if the decision result in the step P44 is NO, but the process ends if the decision result in the step P44 is YES.

On the other hand, if the decision result in the step P41 is NO and the conventional mode is selected, a step P46 decides whether or not the process of detecting the position detection mark M is ended. The process is ends if the decision result in the step P46 becomes YES.

In this state, the stage position of the semiconductor wafer 27 at every moment is detected by the laser measuring equipment 24, and the position detection signal S1 is output to the stage control circuit 61 within the deflection drive control unit 26A. In addition, a stage position D1 which becomes the control target value is output from the stage control circuit 61 to the main deflection control circuit 62.

Thereafter, a step P25 in FIG. 10 carries out a process of calculating an error between the stage control target position and an actual stage position. The error between the control target position of the position detection mark M and the actual moved position is calculated from the stage position information based on the position detection signal S1. The calculated error is added to the deflection data DM and DS.

In addition, the DSP 65 outputs the stage position read clock CLK, the main deflection control signal MD (S) and the main deflection hold signal MH based on the scan control signal SE and the main deflection control signal MD (E).

A step P26 carries out a process of correcting the deflection signals S1 and S2 of the electron beam 21A. In this case, the shot data D2 is output from the pattern generation circuit 66 to the pattern correction circuit 67 based on the scan number signal SC, the main deflection control signal MD (S) and the main deflection hold signal MH. Moreover, the pattern correction circuit 67 corrects the shot data D2.

Next, a step P27 carries out a process of determining the final deflection coordinate related to the electromagnetic deflection. In this case, the pattern correction circuit 67 re-determines the final deflection coordinate of the electromagnetic and electrostatic deflections of the electron beam 21A every time depending on the scan number N of the electron beam 21A when the CPU 26C outputs the scan number value N to the OR circuit OR within the main deflection control unit 66A.

For example, when the scan control signal SE is set in the first register 56 of the main deflection control unit 66A, the counter 55 counts down the scan number value N and outputs the main deflection control signal MD (E) when the count ends. In addition, the pattern generator 59 outputs the pattern generation busy signal PG and the pattern generation count signal PC based on the output value of the AND circuit AND2.

On the other hand, the main deflection control circuit 62 outputs the main deflection data DM and the sub deflection data DS to the respective D/A converters 63A and 63B based on the stage position data D1 and the stage position read clock CLK.

Therefore, in the deflection drive control unit 26A, it is possible to correct the main deflection signal S2 and the sub deflection signal S3 which are supplied to the deflector 22 based on the position detection signal S1 which is related to the stage position of the semiconductor wafer 27 which continuously moves.

Next, a step P28 carries out a process of detecting the position detection mark M of the semiconductor wafer 27 based on the deflection correction process. In this case, the main deflection data DM and the sub deflection data DS are respectively subjected to the D/A conversion in the D/A converters 63A and 63B, and are then amplified by the deflection amplifiers 64A and 64B. These deflection amplifiers 64A and 64B respectively output the main deflection signal S2 and the sub deflection signal S3 to the deflector 22. The secondary electron detector 23 detects the position detection mark M and outputs the mark detection signal S4 by irradiating the electron beam 21A on the position detection mark M, and the electron beam control unit 26 recognizes the position detection mark M from the mark detection signal S4.

A step P29 carries out a process of exposing the exposure region of the semiconductor wafer 27. In this case, the electron beam 21A is deflected and irradiated onto the exposure region of the semiconductor wafer 27. For example, the LSI pattern or the like is drawn in the exposure region of the semiconductor wafer 27 based on the electrostatic deflection signal S3.

Therefore, according to this embodiment of the method, the step P23 shown in FIG. 10 carries out the process of irradiating and deflecting the electron beam 21A onto the position detection mark M of the semiconductor wafer 27, and at the same time, the steps S24 through S27 carry out the processes of detecting the stage position of the semiconductor wafer 27 and correcting the deflection of the electron beam 21A.

For this reason, the step P24 carries out the process of obtaining the stage position information related to the semiconductor wafer 27 for every unit going and returning scan of the electron beam 21A with respect to the position detection mark M. Thereafter, the step P25 carries out the process of correcting the error between the control target position of the position detection mark M and the actual moved position based on the stage position information. Thus, compared to the conventional method, the step P28 can carry out the process of accurately detecting the position detection mark M of the semiconductor wafer 27 based on the deflection correction process which takes into consideration the stage moving speed.

Therefore, even if the moving speed of the semiconductor wafer 27 is increased or changed, the position detection operation can sufficiently follow the movement of the semiconductor wafer 27, and the electron beam 21A will not enter the region B in which the drawing is impossible as was the problem in the conventional method.

For example, if the number of going and returning shots of the electron beam 21A on the position detection mark M per unit scan is 400 and the exposure time per shot is 5 μs, the time required per unit scan is 2 ms.

Next, a description will be given of the comparison of the position detection process according to this embodiment and the position detection process of the conventional method.

For example, if the stage limit speed is calculated for a stage moving distance of 20 μm, the exposure time is 32 ms in the conventional case and the stage limit speed for the conventional method is 20 μm/32 ms=0.6 m/s. On the other hand, according to this embodiment, the stage limit speed is 20 μm/2 ms=10 ms. Hence, it may be seen that this embodiment can speed up the exposure process by approximately 16 times when compared to the conventional method.

In this embodiment, by the step P22 which carries out the mode switching process, the mode in which the process of obtaining the stage position information related to the semiconductor wafer 27 for every unit going and returning scan of the electron beam 21A with respect to the position detection mark M is carried out or the mode in which the process of obtaining the stage position information only once regardless of the unit going and returning scan is carried out is selected.

For this reason, it is possible to selectively carry out the conventional process of detecting the position detection mark M and the process of detecting the position detection mark M according to this embodiment. As a result, it is possible to select the mode to suit the fast moving speed and the slow moving speed of the semiconductor wafer 27 depending on the change in the pattern exposure density on the semiconductor wafer 27.

In addition, the step S28 carries out the process of irradiating and deflecting the electron beam 21A onto the exposure region of the semiconductor wafer 27 which continuously moves. Hence, the range in which the electron beam 21A can be deflected falls within the range in which the drawing in the exposure region or the like of the semiconductor wafer 27 is possible, and the exposure speed can be improved.

Therefore, it is possible to realize exposure apparatuses such as an electron beam exposure apparatus which carries out the exposure process at a high speed with respect to the object which continuously moves while confirming the position detection mark, and an electron beam apparatus which obtains and processes the image to be drawn by such an electron beam exposure apparatus.

Next, a description will be given of the operating principle of a second embodiment of the present invention, by referring to FIG. 13. In FIG. 13, those steps which are the same as those corresponding steps in FIG. 6 are designated by the same reference numerals, and a description thereof will be omitted.

In this embodiment, steps P130A and P130B are carried out in parallel to the steps P13A and P13B. The step P130A judges whether or not the next unit going and returning scan is possible for every unit going and returning scan of the charged particle beam 11A, and continues the unit going and returning scan as much as possible. If it is judged that the stage has moved to an extent such that the unit going and returning scan is impossible, the step P130B carries out a process of correcting the error between the control target position of the position detection mark M and the actual moved position.

For example, it is possible to judge whether or not the next unit going and returning scan of the charged particle beam 11A is possible, that is, whether or not the mark detection mark M is detectable, in the following manner. First, an operation is carried out to calculate the time required to make the unit going and returning scan and to calculate the moving distance required to make the unit going and returning scan of the stage, based on information including the scan pitch, the scan clock, the number of scan points, and the stage moving speed. Then, based on the size of the position detection mark M, the difference between the present position and the target position of the stage, the calculated time and the calculated distance, a judgement is made to determine whether or not the next unit going and returning scan is possible.

This embodiment only differs in that the step P13 includes the steps P130A and 130B in addition to the steps P13A and P13B. Otherwise, the other processes are the same as those of the first embodiment described in conjunction with FIG. 6.

FIG. 14 is a flow chart for explaining a stage position read control operation of the second embodiment of the electron beam exposure apparatus. In FIG. 14, those steps which are the same as those corresponding steps in FIG. 11 are designated by the same reference numerals, and a description thereof will be omitted.

In FIG. 11, a step P51 decides whether or not a mode switching process is carried out. If the decision result in the step P51 is YES and one scan process is to be made, the process advances to the step P42 described above and the operation of detecting the position detection mark M is started. On the other hand, if the decision result in the step P51 is NO and an arbitrary number of scan processes are to be carried out, the process advances to a step P52. The step P52 carries out a process of reading the stage position, and the operation of detecting the position detection mark M is started. Then, a step P53 decides whether or not the detection of the position detection mark M is possible. If the decision result in the step P53 becomes YES, a step P54 decides whether or not all mark detections are ended. The process ends if the decision result in the step P54 is YES, but the process returns to the step P52 if the decision result in the step P54 is NO.

The present invention is applied to the electron beam exposure apparatus in the above described embodiments. However, the present invention can be applied similarly to an exposure apparatus which uses an ion beam or the like, and effects similar to those described above are also obtainable when the present invention is applied to the charged particle beam exposure apparatus.

Further, the present invention is not limited to these embodiments, but various variations and modifications may be made without departing from the scope of the present invention.

What is claimed is:

1. A charged particle beam exposure apparatus comprising:
    a source for irradiating a charged particle beam on a continuously moving object which has a position detection mark provided thereon and is carried on a movable stage;
    deflection means for deflecting the charged particle beam based on deflection signals;
    first detection means for detecting the position detection mark of the object;
    second detection means for detecting a stage position of the continuously moving object and for outputting a position detection signal;
    moving means for moving the stage which carries the object; and
    control means for controlling inputs and outputs of said source, said deflection means, said first and second detection means and said moving means,
    said control means including means for correcting the deflection signals which are supplied to said deflection means so that the position detection mark is irradiated by the charged particle beam based on the position detection signal which is output from said second detection means and is related to the stage position of the object which is continuously moved by said moving means.

2. The charged particle beam exposure apparatus as claimed in claim 1, wherein said control means includes deflection drive control means for re-determining a final deflection coordinate of the charged particle beam based on the position detection signal which is related to the stage position of the continuously moving object and is output from said second detection means for every unit going and returning scan of the charged particle beam with respect to the position detection mark of the continuously moving object.

3. The charged particle beam exposure apparatus as claimed in claim 2, wherein said deflection drive control means determines the final deflection coordinate related to the deflection of the charged particle beam by said deflection means every time depending on a number of scans of the charged particle beam.

4. The charged particle beam exposure apparatus as claimed in claim 3, wherein said deflection means includes an electromagnetic deflector and an electrostatic deflector, and said deflection drive control means determines the final deflection coordinate related to electromagnetic and electrostatic deflections of the charged particle beam by said deflection means every time depending on the number of scans of the charged particle beam.

5. The charged particle beam exposure apparatus as claimed in claim 1, wherein said deflection means includes an electromagnetic deflector and an electrostatic deflector, said control means outputs as the deflection signals a first deflection signal for making a first deflection of the charged particle beam at the electromagnetic deflector and a second deflection for making a second deflection of the charged particle beam at the electrostatic deflector, and the charged particle beam is deflectable by the first deflection in a range greater than that of the second deflection.

6. A method of controlling a charged particle beam exposure apparatus which irradiates a charged particle beam on an object which has a position detection mark provided thereon and is carried on a movable stage, said method comprising the steps of:
    (a) continuously moving the stage so as to move the object;
    (b) deflecting the charged particle beam onto the position detection mark of the object;
    (c) detecting a stage position of the object and correcting the deflection of the charged particle beam depending on the detected stage position; and
    (d) detecting the position detection mark of the object by the charged particle beam the deflection of which is corrected by said step (c).

7. The method of controlling the charged particle beam exposure apparatus as claimed in claim 6, wherein said step (c) obtains stage position information related to the stage position of the object for every unit going and returning scan of the charged particle beam with respect to the position detection mark, and corrects the deflection of the charged particle beam by correcting an error between a control target position and an actual moved position of the position detection mark based on the stage position information.

8. The method of controlling the charged particle beam exposure apparatus as claimed in claim 6, wherein said step (c) generates a first deflection signal for making a first deflection of the charged particle beam at an electromagnetic deflector and a second deflection signal for making a second deflection of the charged particle beam at an electrostatic deflector, and corrects the first and second deflection signals based on the stage position, where the charged particle beam is deflectable by the first deflection in a range greater than that of the second deflection.

9. The method of controlling the charged particle beam exposure apparatus as claimed in claim 6, wherein said step (c) is selectively carried out in one of first and second modes, said step (c) obtains the stage position information of the object for every unit going and returning scan of the charged particles beam with respect to the position detection mark in the first mode, and said step (c) obtains the stage position information only once regardless of the unit going and returning scan of the charged particle beam in the second mode.

10. The method of controlling the charged particle beam exposure apparatus as claimed in claim 9, wherein said step (b) consecutively deflects and scans the charged particle beam onto the position detection mark a plurality of times if said step (c) is carried out in the second mode.

11. The method of controlling the charged particle beam exposure apparatus as claimed in claim 6, which further comprises the step of:

(e) irradiating and deflecting the charged particle beam within an exposure region of the object after said step (d) detects the position detection mark of the object which continuously moves.

12. The method of controlling the charged particle beam exposure apparatus as claimed in claim 6, wherein said step (c) re-determines a final deflection coordinate of the charged particle beam based on the stage position for every unit going and returning scan of the charged particle beam with respect to the position detection mark of the object.

13. The method of controlling the charged particle beam exposure apparatus as claimed in claim 12, wherein said step (c) determines the final deflection coordinate related to the deflection of the charged particle beam every time depending on a number of scans of the charged particle beam.

14. The method of controlling the charged particle beam exposure apparatus as claimed in claim 13, wherein the charged particle beam exposure apparatus includes an electromagnetic deflector and an electrostatic deflector, and said step (c) determines the final deflection coordinate related to electromagnetic and electrostatic deflections of the charged particle beam by the electromagnetic and electrostatic deflectors every time depending on the number of scans of the charged particle beam.

* * * * *